United States Patent [19]

Liebel

[11] 4,263,676

[45] Apr. 21, 1981

[54] RF AMPLIFYING SYSTEM HAVING IMAGE REJECTION

[75] Inventor: Craig A. Liebel, Schaumburg, Ill.

[73] Assignee: Motorola, Inc., Schaumburg, Ill.

[21] Appl. No.: 60,091

[22] Filed: Jul. 23, 1979

[51] Int. Cl.³ .......................... H04B 1/12; H04B 1/16
[52] U.S. Cl. .................................... 455/285; 455/286; 455/294; 455/302; 455/311
[58] Field of Search ....................... 455/283, 285–287, 455/293, 294, 302, 311, 341; 330/277, 302, 305, 306

[56] References Cited

U.S. PATENT DOCUMENTS

| 1,707,944 | 4/1929 | Roos | 455/311 |
|---|---|---|---|
| 2,233,470 | 3/1941 | Case | 455/285 |
| 3,528,023 | 9/1970 | Jeffers | 330/302 |
| 4,065,723 | 12/1977 | Endres et al. | 330/302 |

Primary Examiner—Marc E. Bookbinder
Attorney, Agent, or Firm—James S. Pristelski; James W. Gillman

[57] ABSTRACT

An improved RF amplifier system in which an undesired frequency such as the image frequency is rejected. The amplifier circuit includes a first tank circuit tuned to a first predetermined frequency by a first voltage variable capacitor and a second tank circuit tuned to a second frequency by a second voltage variable capacitor. A dual gate FET is coupled to the tank circuits such that the drain of the FET is across the first tank circuit and the source is connected across the second tank circuit. The second tank circuit is tuned to the image frequency or the undesired frequency while the first tank circuit is tuned to the desired frequency. When the image or undesired frequency is received the drain tank impedance of the FET becomes very small while the source tank impedance is relatively large which effectively degenerates the amplifier gain at the image frequency. When this occurs the current flowing into the first tank circuit is reduced causing the voltage appearing across the drain to become reduced and the undesired signals to be rejected in the IF section of the receiver.

3 Claims, 4 Drawing Figures

4,263,676

RF AMPLIFYING SYSTEM HAVING IMAGE REJECTION

BRIEF STATEMENT OF INVENTION

This invention relates to an improved radio frequency amplifier circuit in a receiver and, in particular, to the utilization of gain degeneration therein at an undesired frequency, such as, the image frequency to reject undesired signals.

BACKGROUND OF THE INVENTION

It is known to use image rejection techniques in a radio receiver by the use of high selectivity in a tuned circuit prior to and subsequent to the RF amplifier circuit. However, more recently there has been an increased demand for a broadly tuned RF preselector to pass without distortion amplitude and phase modulated signal information. Under these conditions it is desirable to reject image or other undesired frequencies of the desired RF signal.

Various approaches used to accomplish image frequency rejection have been to tune the RF signals in isolated circuits as described, for example, in U.S. Pat. No. 3,528,023 to Jeffers. Still another approach has been to receive the RF signal and amplify it and use this output to cooperate with an oscillator to mix with the RF to produce an IF as described for example in U.S. Pat. No. 3,348,155 to Von Recklinghausen.

In accordance with the present invention an RF amplifying system having image frequency rejection is provided by making the gain of the RF amplifier frequency dependent by the use of an anti-resonant circuit tuned to the image frequency causing degeneration of the normal amplifying function at the specified image frequency.

OBJECTS OF THE INVENTION

It is therefore a principal object of the present invention to improve the frequency discriminating characteristics of RF amplifier circuits.

It is a further object of the present invention to reject unwanted signals in the desired bands received.

It is a further object of the present invention to amplify low level signals while attenuating high level signals in a predetermined broadcast band.

It is a further object of the present invention to provide for gain degeneration in an RF amplifier circuit at the image frequency while tuned broadly to the desired signal frequency.

DETAILED DESCRIPTION OF THE INVENTION

Figure 1:
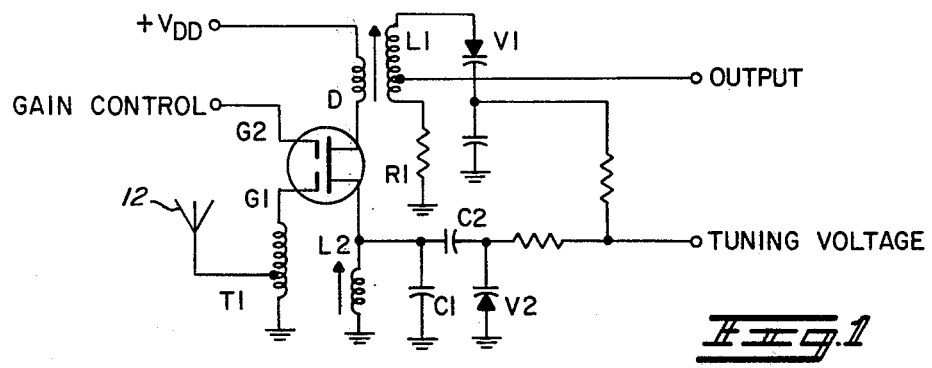

The above objects and still others will become more apparent upon an understanding of the following specification which should be read in conjunction with the drawings in which:

FIG. 1 is a schematic of the circuit according to the invention, and

Figure 2A:
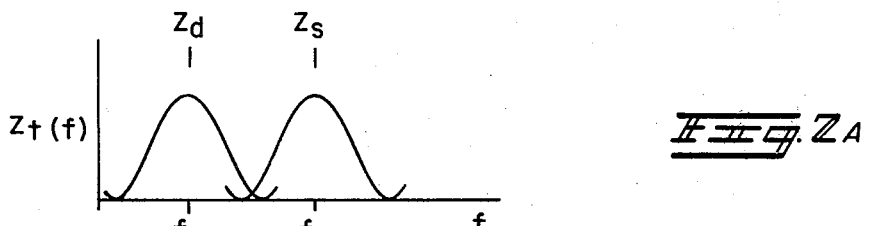
Figure 2B:
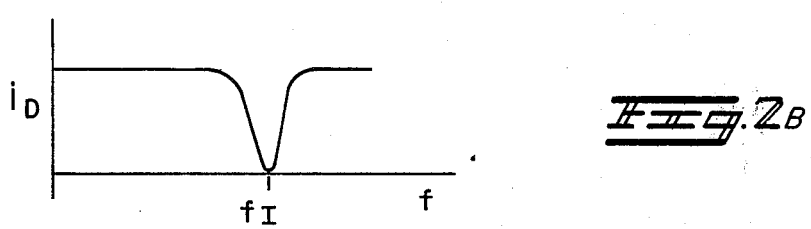
Figure 2C:
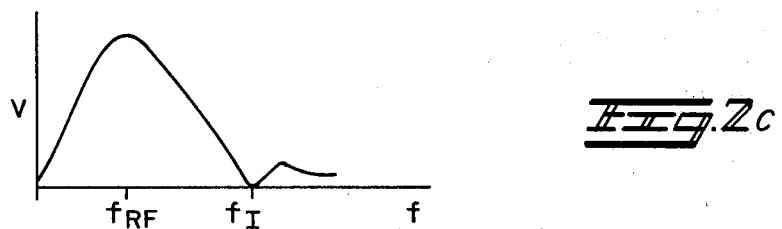

FIGS. 2(a)–2(c) depict magnitude of the network transfer function versus frequency plots illustrating circuit operation.

In accordance with the present invention an RF amplifier system having image frequency rejection capability is shown in the FIG. 1. Typically this system can be used in an automotive AM broadcast band receiver which typically is in the 530 to 1610 KHz range. When the RF preselector is broadened to accommodate the modulation components associated with complex modulation systems such as AM/FM, there is an increased adequate rejection problem in image frequency signals. Normally the image frequency is twice the IF frequency removed from the signal frequency. As shown in FIG. 1 the system of the invention includes a dual gate MOS—FET as the active amplifying device whose gain is controlled by a DC voltage applied to gate electrode G2. Voltage normally is supplied to FET from the antenna 12 through a transformer T1 which serves as an impedance matching transformer.

The drain load of the FET is a single pole anti-resonant tank consisting of coil L1, resistor R1, and varactor diode V1 with an impedance magnitude varying with frequency. The design of the tank components is such that the tank exhibits a constant bandwidth across the tuning range. Tuning is achieved by varactor diode V1 whose capacitance varies with the tuning voltage. The bandwidth of this tank is chosen so that no loss or phase non-linearities will occur from strong signal effects or varactor mistracking with the local oscillator.

In accordance with the present invention to reject image frequency signals which are undesirable a second varactor tuned LC tank consisting of capacitors C1, C2, coil L2 and varactor diode V2 is connected to the source of the FET. This tank is tuned to the image frequency at the time that the previously described tank circuit in the drain is tuned to the signal frequency. It will be appreciated that at the desired signal frequency the drain tank impedance $Z_D$ is at its maximum and that the source tank impedance $Z_S$ is relatively small thus producing an amplifier gain which is high. However, at the image or undesired frequency it will be further appreciated that the drain tank impedance $Z_D$ becomes very small while the source tank impedance $Z_S$ is relatively large which effectively degenerates amplifier gain at the image frequency. When this occurs the current flowing into the tank circuit connected to the drain of the FET is reduced causing the voltage appearing across the drain tank to become reduced. As a result, undesired signals are then rejected in the IF section of the receiver.

A better understanding of the operation of the invention can be had from FIGS. 2(a)–2(c). FIG. 2(a) depicts the impedance characteristics of the anti-resonant circuits coupled to the drain and source of the FET represented as $Z_D$ and $Z_S$, respectively. It will be appreciated that maximum impedance occurs at the anti-resonant frequency of each tank circuit at the signal frequency fRF and image frequency fI. As shown in FIG. 2(b) the drain current iD is reduced to a minimum at the image frequency fI. As shown in FIG. 2(c) the voltage V appearing across the tank circuit connected to the drain is the product of the drain current with the drain impedance.

It will now be appreciated that with the above described invention that a gain degeneration occurs at the image frequency which effect is to reduce the gain of the amplifier and thus the current and voltage produced in the amplifier output. Furthermore, by virtue of the unique design of the circuit it is possible to vary the tuning frequency in either the drain or source of the amplifier or both depending upon the intended operation. By virtue of the selectivity in operation the RF amplifier can be easily adapted to reject image frequency signals or any selected signal which can track with or be independent from the signals in the broadcast band. It will be further appreciated that the circuit of the invention has the advantage of a low number of factory adjustments, no moving mechanical parts and yet provides good tracking with the local oscillator of a receiver.

I claim:

1. An improved RF input amplifier system comprising:

an antenna for receiving RF signals in a predetermined frequency band;

amplifying circuit means including at least a first, second and third electrodes;

circuit means coupling said antenna to said first electrode;

first tank circuit means coupled to the second electrode, said first tank circuit means including a first voltage variable capacitor, said first tank circuit means selectively tunable to a predetermined desired reception frequency within the predetermined frequency band by applying a tuning voltage bias of a predetermined magnitude to said first voltage variable capacitor; and second tank circuit means coupled to the third electrode of the amplifying circuit means, said second tank circuit means including a second voltage variable capacitor, said second tank circuit means selectively tunable to a predetermined image frequency associated with the predetermined desired reception frequency by applying a tuning voltage bias of similar predetermined magnitude to the second voltage variable capacitor such that the second tank circuit means is tuned to the predetermined image frequency associated with the predetermined desired reception frequency at the same time that the first tank circuit means is tuned to the predetermined desired reception frequency and such that upon receipt of a signal containing both the desired reception and the image frequencies, the current flowing from the second electrode is reduced to cause voltage output in the first tank circuit means to be reduced during the presence of the image frequency.

2. An apparatus according to claim 1 wherein said amplifying means comprises a FET in which said first electrode is a gate, said second electrode is a drain, and said third electrode is a source.

3. An apparatus according to claim 2 wherein said FET is a dual gate FET including a fourth electrode coupled to an AGC signal.

* * * * *